(12) United States Patent
Shumkov et al.

(10) Patent No.: US 11,303,210 B2
(45) Date of Patent: Apr. 12, 2022

(54) CURRENT SENSE CIRCUIT TOPOLOGY

(71) Applicant: TEXAS INSTRUMENTS INCORPORATED, Dallas, TX (US)

(72) Inventors: Ivan Shumkov, Freising (DE); Christian Harder, Freising (DE); Erich-Johann Bayer, Thonhausen (DE); Joerg Kirchner, Mauern (DE); Gaetano Petrina, Kirchdorf (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/708,066

(22) Filed: Dec. 9, 2019

(65) Prior Publication Data

US 2021/0175804 A1   Jun. 10, 2021

(51) Int. Cl.
*H02M 3/158* (2006.01)
*H02M 1/00* (2006.01)

(52) U.S. Cl.
CPC ........ *H02M 3/1582* (2013.01); *H02M 1/0009* (2021.05); *H02M 3/158* (2013.01)

(58) Field of Classification Search
CPC ............ H02M 3/155–1588; H02M 2001/0009
See application file for complete search history.

(56) References Cited

U.S. PATENT DOCUMENTS

| | | | |
|---|---|---|---|
| 7,586,367 B2 | 9/2009 | De Lima Filho | |
| 8,049,523 B2 | 11/2011 | Gazit | |
| 8,120,346 B2 | 2/2012 | Ostram et al. | |
| 8,866,464 B2 | 10/2014 | Ragona et al. | |
| 2006/0097710 A1* | 5/2006 | Xi | H02M 3/156 323/282 |
| 2011/0050250 A1* | 3/2011 | Ivanov | H02M 3/156 324/654 |
| 2014/0347078 A1 | 11/2014 | Qin | |
| 2015/0171737 A1* | 6/2015 | Pagano | G01R 19/0092 323/284 |
| 2017/0040892 A1* | 2/2017 | Rutkowski | H02M 3/158 |
| 2018/0331624 A1* | 11/2018 | Pullen | H02M 1/088 |

OTHER PUBLICATIONS

International Search Report in corresponding PCT Application No. PCT/US 2020/063544, dated Mar. 4, 2021 (2 pages).

* cited by examiner

*Primary Examiner* — Peter M Novak
(74) *Attorney, Agent, or Firm* — Mark Allen Valetti; Charles A. Brill; Frank D. Cimino

(57) ABSTRACT

Aspects of the present disclosure provide for a circuit. In at least some examples, the circuit includes a first switch coupled between a first node and a second node and a second switch coupled between a third node and the second node. The circuit further includes a resistor coupled between the second node and a fourth node and a capacitor comprising a first terminal coupled to the fourth node and a second terminal. The circuit further includes a transistor comprising a drain terminal coupled to the third node, a source terminal coupled to a fifth node, and a gate terminal and an amplifier comprising a first input terminal coupled to the fifth node, a second input terminal coupled to the fourth node, and an output terminal coupled to a sixth node.

19 Claims, 13 Drawing Sheets

CURRENT SENSE CIRCUIT TOPOLOGY

BACKGROUND

A switched mode power supply (SMPS) transfers power from an input power source to a load by switching one or more power transistors coupled through a switch node/terminal to an energy storage element (such as an inductor/transformer and/or capacitor), which is capable of coupling to the load. The power transistors can be included in a power converter that includes, or is capable of coupling to, the energy storage element. An SMPS can include an SMPS controller to provide one or more gate drive signals to the power transistor(s). The SMPS controller, in some examples, controls the power converter based on one or more sensed signals or signals derived from the power converter. These signals can include information such as input current to the power converter or average inductor current of the power converter. In some implementations, challenges can arise in efficiently generating these signals that are sensed or derived from the power converter.

SUMMARY

Aspects of the present disclosure provide for a circuit. In at least some examples, the circuit includes a first switch coupled between a first node and a second node and a second switch coupled between a third node and the second node. The circuit further includes a resistor coupled between the second node and a fourth node and a capacitor comprising a first terminal coupled to the fourth node and a second terminal. The circuit further includes a transistor comprising a drain terminal coupled to the third node, a source terminal coupled to a fifth node, and a gate terminal and an amplifier comprising a first input terminal coupled to the fifth node, a second input terminal coupled to the fourth node, and an output terminal coupled to a sixth node.

Other aspects of the present disclosure provide for a circuit. In at least some examples, the circuit includes a first switch coupled between a first node and a second node, a second switch coupled between the first node and a third node, and a third switch coupled between the second node and the third node. The circuit further includes a resistor coupled between the second nodes and a fourth node and a capacitor coupled between the fourth node and the third node. The circuit further includes a first transistor comprising a drain terminal coupled to the first node, a source terminal coupled to a fifth node, and a gate terminal and an amplifier comprising a first input terminal coupled to the fourth node, a second input terminal coupled to the third node, and an output terminal coupled to a sixth node.

Other aspects of the present disclosure provide for a circuit. In at least some examples, the circuit includes a first transistor comprising a drain terminal coupled to a first node, a source terminal coupled to a second node, and a gate terminal and a second transistor comprising a drain terminal coupled to the second node. The circuit further includes a current sense circuit coupled to the first node and the second node. The current sense circuit is configured to operate in a first configuration to determine a current flowing through the first transistor and generate a signal with a value that is a scaled representation of the current flowing through the first transistor. The current sense circuit is further configured to operate in a second configuration to determine an average current flowing through the second node and generate a signal with a value that is a scaled representation of the average current flowing through the second node.

Aspects of the present disclosure provide for a system. In at least some examples, the system includes a power converter and a current sense circuit. The power converter includes a first transistor comprising a drain terminal coupled to a first node, a source terminal coupled to a second node, and a gate terminal, and a second transistor comprising a drain terminal coupled to the second node. The current sense circuit is coupled to the first node and the second node. The current sense circuit is configured to operate in a first configuration to determine an input current of the power converter and generate a signal with a value that is a scaled representation of the input current of the power converter. The current sense circuit is further configured to operate in a second configuration to determine an average current flowing through the second node and generate a signal with a value that is a scaled representation of the average current flowing through the second node.

BRIEF DESCRIPTION OF THE DRAWINGS

For a detailed description of various examples, reference will now be made to the accompanying drawings in which.

DETAILED DESCRIPTION

Figure 1:
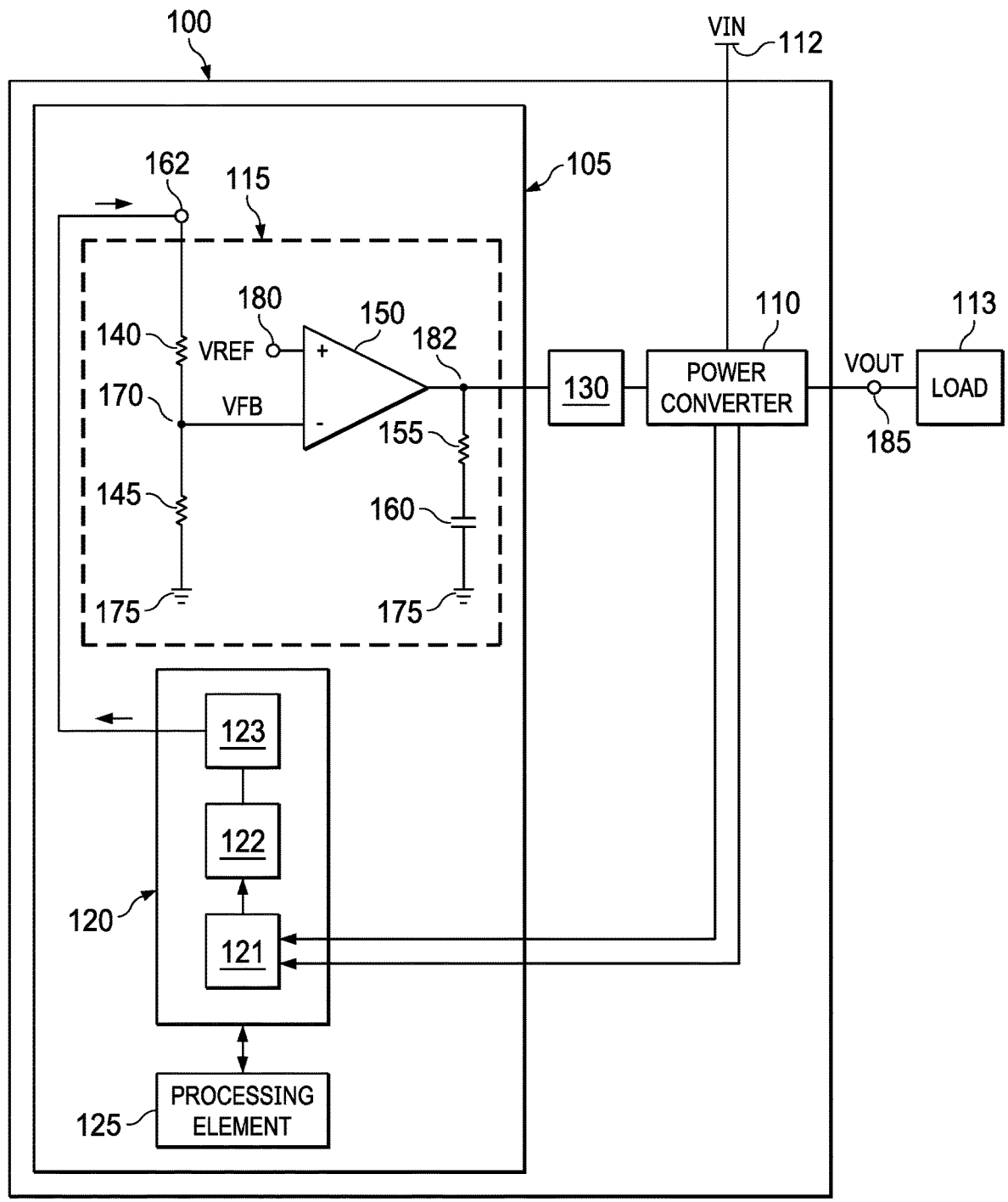
FIG. 1 shows a block diagram of an illustrative switched mode power supply in accordance with various examples.

A switched mode power supply (SMPS) can include elements such as a controller, gate driver, and a power converter. In some examples, the SMPS further includes a current sense circuit. The current sense circuit measures a discontinuous current of the power converter and outputs a signal representative of (e.g., proportional to) the current being measured. The discontinuous current results from switching of the power converter. In some implementations, each current to be measured has a dedicated circuit. For example, a dedicated circuit may measure input current, another dedicated circuit may measure average inductor current, and so forth. However, the implementation of multiple dedicated circuits for monitoring the power converter can be inefficient in both power consumption during operation and space consumed by the circuits. Additionally, at least some current sense circuits can have inefficient topologies. For example, some current sense circuits may sense a current, process the current signal to convert the current signal to a voltage signal that is mirrored through a voltage mirror, and then process the voltage signal to convert that voltage signal back to a current signal. At least some of these signals have a high frequency such that one or more high bandwidth amplifiers are used in the processing. The high bandwidth amplifiers, in some examples, consume a greater amount of current than low bandwidth amplifiers and require additional circuit complexity to provide for offset cancellation. In contrast, a current sense circuit that performs the processing at low frequency and utilizing low bandwidth amplifiers may provide certain benefits in current consumption and circuit complexity. The benefits can lead to reduced cost of manufacture, implementation, and/or operation of the current sense circuit.

At least some aspects of the present disclosure provide for a current sense circuit. The current sense circuit, in at least some examples, senses a current flowing through a power converter and outputs a signal having a current proportional to the current flowing through the power converter. In some examples, the current flowing through the power converter is an average input current (IINAVE). In other examples, the current flowing through the power converter is an average inductor current (ILAVE). Accordingly, in at least some examples the current sense circuit is a multi-function circuit. For example, when in a first configuration the current sense circuit generates an output signal proportional to IINAVE. When in a second configuration, the current sense circuit generates an output signal proportional to ILAVE. The current sense circuit, in various implementations, is suitable for measuring IINAVE and ILAVE in a plurality of power converter topologies including buck, buck-boost, boost, and inverting buck-boost. More generally, the teachings of the present disclosure may be applicable to any switched mode system, whether related to providing power or unrelated to providing power.

In at least some examples, the current sense circuit amplifies a difference between a current flowing through a sense FET (e.g., a scaled replica FET of the high side transistor) of the current sense circuit and an output of a low-pass filter that averages a current flowing through the current sense circuit. The current flowing through the current sense circuit that is averaged may be, for example, an input current of the power converter or an inductor current of the power converter. The current sense circuit further drives a voltage controlled current source based on a result of the amplification to generate the current proportional to the current flowing through the power converter. In at least some examples, this current is provided to another circuit or component for monitoring of the power converter and/or control of the power converter. By low-pass filtering the current flowing through the current sense circuit, in at least some examples, subsequent processing of the current sense circuit may be performed at a low frequency. For example, at least partially because of the filtering, the amplifier that amplifies the difference between the current flowing through the sense FET and the output of the low-pass filter may be a low bandwidth amplifier, providing at least some of the benefits discussed above.

Turning now to FIG. 1, a block diagram of an illustrative SMPS 100 is shown. In at least one example, the SMPS 100 includes a controller 105 and a power converter 110. The SMPS 100, at least through the power converter 110, switches power provided at the node 185 by a power source 112. In some examples, the power is switched to a load 113. The power converter 110 is, for example, a buck-boost power converter that is capable of operating according to a buck mode of operation, a boost mode of operation, and a buck-boost mode of operation. In other examples, the power converter 110 is a buck power converter capable of operating according to the buck mode of operation. In yet other examples, the power converter 110 is a boost converter capable of operating according to the boost mode of operation. In yet other examples, the power converter 110 is an inverting buck converter capable of operating according to the buck mode of operation and inverting a polarity of VOUT with respect to a polarity of VIN.

In at least one example, the controller 105 includes, or is configured to couple to, a feedback circuit 115, a current sense circuit 120, a processing element 125, and a gate driver 130. At least one example of the SMPS 100 includes at least some aspects of the controller 105 and the power converter 110 on a same semiconductor die and/or in a same component package, while in other examples the controller 105 and the power converter 110 may be fabricated separately and configured to couple together. For example, at least some aspects of the controller 105 may be fabricated separately and coupled together. Accordingly, while illustrated as not including the gate driver 130, in at least one example the controller 105 does include the gate driver. Additionally, in at least some examples the controller 105 does not include the current sense circuit 120 but is instead configured to couple to the current sense circuit 120. Alternatively, in at least some examples one or more components of the power converter 110 are implemented on a same die as one or more components of the current sense circuit 120. Further, while the current sense circuit 120 is described herein as detecting a current flowing through the power converter 110, the present disclosure is not so limited. Instead, the current sense circuit 120 is suitable for measuring a discontinuous (e.g., switched) current in any circuit in which the current flows through a FET across which the current sense circuit 120 can couple to sense or measure the discontinuous current.

In at least one example, the feedback circuit 115 includes a resistor 140 coupled between a node 162 and a node 170 and a resistor 145 coupled between the node 170 and a ground node 175. The feedback circuit 115 further includes an amplifier 150 having a first input terminal (e.g., a non-inverting input terminal) coupled to a node 180 and configured to receive a reference voltage (VREF) at the node 180. The amplifier 150 further has a second input terminal (e.g., an inverting input terminal) coupled to the node 170, and an output terminal coupled to a node 182. A resistor 155 is coupled between the node 182 and a top plate of a capacitor 160 and a bottom plate of the capacitor 160 is coupled to the ground node 175.

In at least some examples, the current sense circuit 120 has front end 121 having a first input terminal coupled to the power converter 110, a second input terminal coupled to the power converter 110, a gain stage 122 coupled between the front end 121 and a voltage controlled current source 123 having an output terminal. In some implementations, the output terminal of the voltage controlled current source 123 is coupled to the node 162. Although not shown, in at least some implementations, the output terminal of the voltage controlled current source 123 is further coupled to an input terminal of the processing element 125. The processing element 125 further has one or more output terminals coupled to additional input terminals of the current sense circuit 120 (e.g., control terminals of switches of the current sense circuit 120, such as in the front end 121). The processing element 125 is, in various examples, a controller, microcontroller, processor, logic circuit, or any other component capable of receiving input signals, making one or more determinations or decisions, and outputting one or more control signals. A buffer or other isolation circuit (not shown) may be coupled between the node 162 and the resistor 140 to prevent impedance of the resistor 140 and/or the resistor 145 from affecting operation of the current sense circuit 120 and/or the processing element 125.

In some examples, the gate driver 130 has an input terminal coupled to the node 182, and one or more output terminals coupled to the power converter 110 While illustrated as having only one coupling between the driver 130 and the power converter 110, in various examples the driver 130 may have a plurality of couplings to the power converter 110. For example, the driver 130 may include a first output terminal coupled to a gate terminal of a high-side transistor (not shown) of the power converter 110 and a second output terminal coupled to a gate terminal of a low-side transistor (not shown) of the power converter 110. In at least some examples, the gate driver 130 outputs a high-side gate control signal (HSCTRL) at a first output terminal of the gate driver 130 and outputs a low-side gate control signal (LSCTRL) at a second output terminal of the gate driver 130. Generally, in at least some examples a number of couplings between the driver 130 and the power converter 110 may be equal to or greater than a number of transistors (not shown) of the power converter 110.

In at least one example, the SMPS 100 is configured to receive VIN from the power source 112 and provide VOUT at the node 185 for supplying the load 113. VOUT is based at least partially on the input voltage and VREF received by the SMPS 100 at the node 180. VREF may be received from any suitable device (not shown) such as a processor, microcontroller, or any other device exerting control over the SMPS 100 to control a value of VOUT. Although not shown, in at least some examples VREF is provided to the feedback circuit 115 by the processing element 125. In other examples, VREF is received by the SMPS 100 at a pin or other user-facing terminal at which a user provides a signal for use as VREF. VREF has a value representative of a desired (e.g., user-desired, target, preconfigured, programmed, etc.) value of a feedback voltage (VFB) that is a scaled representation of the output of the current sense circuit 120. For example, VFB is a scaled representation of IINAVE or a scaled representation of ILAVE.

In at least one example, the feedback circuit 115 is configured to receive VREF and the output of the current sense circuit 120 and generate an error signal (ERROR) indicating a variation in VREF from VFB. In at least some examples, VFB is an output of a voltage divider formed of the resistor 140 and the resistor 145, where an input to the voltage divider is the output of the current sense circuit 120. In at least some examples, the error signal is generated by the amplifier 150 (e.g., such as an error amplifier or a transconductance amplifier), where a current value of the error signal indicates the variation in VREF from VFB. The error signal is subsequently filtered by the resistor 155 and the capacitor 160 before being received as a control signal by the gate driver 130.

The current sense circuit 120, in some examples, monitors a current flowing through the power converter 110 (e.g., IINAVE or (LAVE) and generates an output signal. Based on the monitored current, the current sense circuit 120 generates and outputs a signal having a current proportional to the current flowing through the power converter 110. In at least some examples the current sense circuit 120 is a multi-function circuit (e.g., monitoring IINAVE or (LAVE), as discussed above. For example, when in a first configuration the current sense circuit 120 generates an output signal proportional to IINAVE. When in a second configuration, the current sense circuit 120 generates an output signal proportional to ILAVE. The configuration of the current sense circuit 120 is changed, in some implementations, by one or more signals received by the front end 121. For example, the front end 121 receives one or more signals that control switches (not shown) of the front end 121 to be in open or closed states, defining the configuration of the current sense circuit 120. In some examples, the gain stage 122 of the current sense circuit 120 amplifies a difference between a current flowing through a sense FET (not shown) of the front end 121 and an output of a low-pass filter (not shown) of the front end 121. The current sense circuit 120 further drives the voltage controlled current source 123 based on a result of the amplification to generate the current proportional to the current flowing through the power converter 110. In at least some examples, this current is provided to another circuit or component for monitoring of the power converter 110 and/or control of the power converter 110. For example, the current sense circuit 120 provides the current to the feedback circuit 115 for creation of VFB and comparison to VREF and/or to the processing element 125 for use by the processing element 125.

Based on the control signal received from the feedback circuit 115, the gate driver 130 generates one or more gate control signals for controlling power transistors of the power converter 110, as discussed above. For example, the gate driver 130 generates gate control signals that alternatingly, and selectively, turn the power transistors of the power converter on and off to energize and de-energize elements such as an inductor and/or a capacitor. This energizing and de-energizing provides the buck, boost, and/or buck-boost functionality discussed herein. The gate driver 130 is implemented according to any suitable architecture, the scope of which is not limited herein.

Figure 2A:
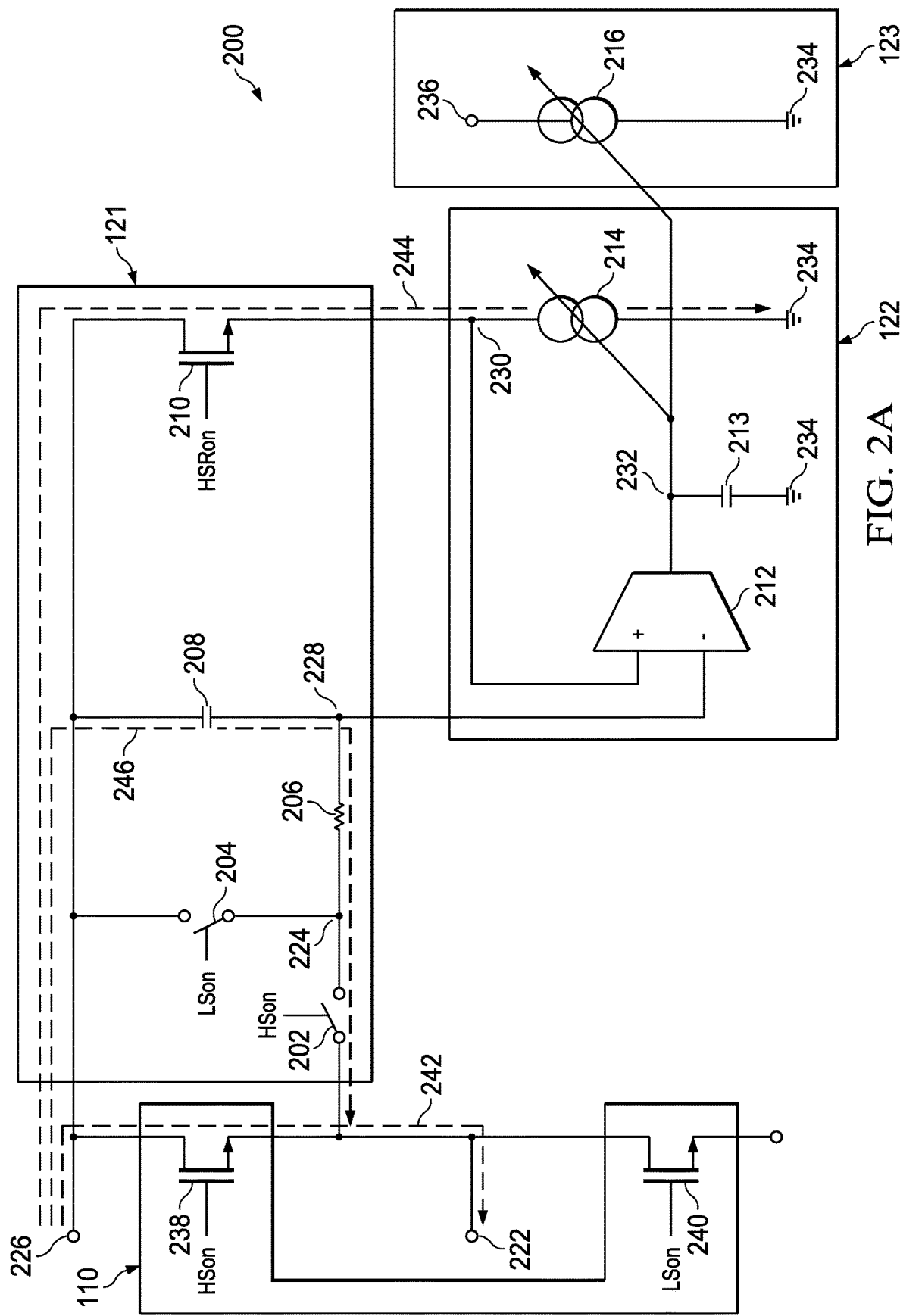
FIG. 2A shows a schematic diagram of an illustrative current sense circuit in accordance with various examples.
Figure 2B:
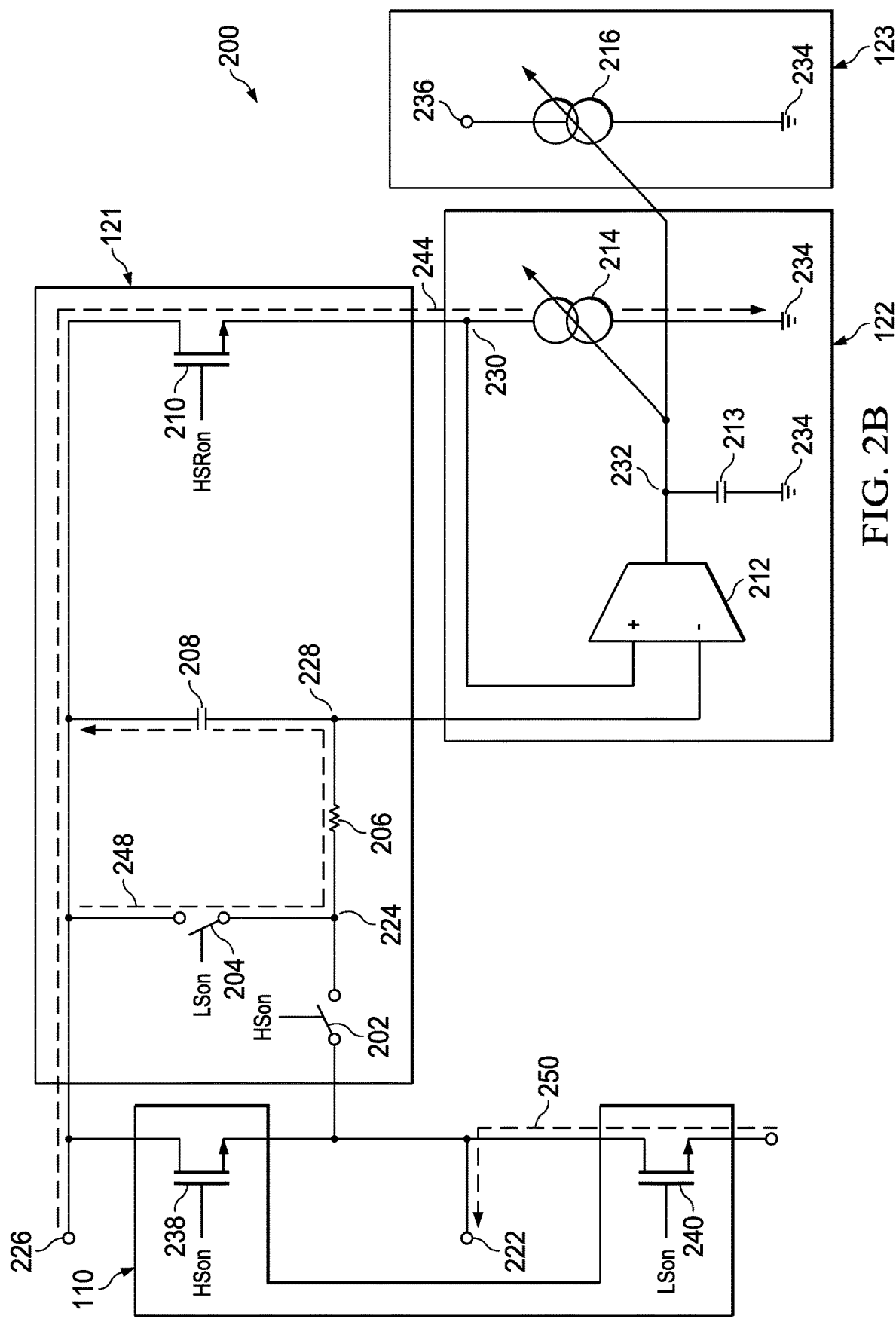
FIG. 2B shows a schematic diagram of an illustrative current sense circuit in accordance with various examples.

Turning now to FIGS. 2A and 2B, schematic diagrams of an illustrative current sense circuit 200 are shown. In at least some examples, the circuit 200 is suitable for implementation as the current sense circuit 120 of the SMPS 100 of FIG. 1. Accordingly, reference is made to at least some components of FIG. 1 in describing FIGS. 2A and 2B. The circuit 200, in some examples, is suitable for monitoring IINAVE and ILAVE (non-simultaneously) in buck power converter topology, an inverting buck power converter topology, and/or a buck-boost power converter topology.

In an example architecture, the circuit 200 includes a switch 202, a switch 204, a resistor 206, a capacitor 208, a replica FET 210, an amplifier 212, a capacitor 213, voltage controlled current source 214, and a voltage controlled current source 216. The switch 202 is coupled between a node 222 and a node 224. The switch 204 is coupled between a node 226 and the node 224. The resistor 206 is coupled between the node 224 and a node 228. The capacitor 208 is coupled between the node 226 and the node 228. The replica FET 210 has a drain terminal coupled to the node 226, a source terminal coupled to a node 230, and a gate terminal. The amplifier 212 has a first input terminal (e.g., a non-inverting input terminal) coupled to the node 230, a second input terminal (e.g., an inverting input terminal) coupled to the node 228, and an output terminal coupled to a node 232. In at least some examples, the capacitor 213 is coupled between the node 232 and a ground node 234. The voltage controlled current source 214 has a first terminal coupled to the node 230, a second terminal coupled to the ground node 234, and a control terminal coupled to the node 232. The voltage controlled current source 216 has a first terminal coupled to a node 236, a second terminal coupled to the ground node 234, and a control terminal coupled to the node 232. In at least some examples, a current mirror (not shown) is coupled between the node 236 and a node at which the circuit 200 outputs a signal representative of the current flowing through the power converter 110. In some examples, the current mirror is coupled between the node 236 and the node 162 of FIG. 1 to provide the signal representative of the current flowing through the power converter 110 at the node 162. In other examples, the signal representative of the current flowing through the power converter 110 is provided directly at the node 236, for example, such that the node 236 and the node 162 may be regarded as being the same node.

In at least some examples, the circuit 200 is implemented on a same die as at least some transistors that will be monitored by the circuit 200. For example, the circuit 200 may be implemented on a same die as at least some components of the power converter 110. In such examples, the circuit 200 further includes, or is configured to couple to, a FET 238 and a FET 240. The FET 238 has a drain terminal coupled to the node 226, a source terminal coupled to the node 222, and a gate terminal. The FET 240 has a drain terminal coupled to the node 222, a source terminal, and a gate terminal. A node to which the source terminal of the FET 240 couples, or is configured to couple, may depend on a particular topology and/or desired operation of the power converter 110. For example, a node to which the source terminal of the FET 240 couples may be determined based on the FET 240 being of p-type or n-type. Additionally, in at least some examples the switch 202 is configured to receive and be controlled by a same high-side control signal (HSon) as is received at the gate terminal of the FET 238. The switch 204 is configured to receive and be controlled by a same low-side control signal (LSon) as is received at the gate terminal of the FET 240. The replica FET 210 is configured to receive and be controlled by a control signal HSRon. When HSon is asserted, the switch 202 is closed. Otherwise, the switch 202 is open. When LSon is asserted, the switch 204 is closed. Otherwise, the switch 204 is open. In at least some examples, HSon and LSon are logical inversions of each other.

In an example of operation, the circuit 200 monitors a current across the FET 238 to output a signal at the node 236 having a current proportional to the current across the FET 238 (e.g., a current flowing through the power converter 110). In at least some examples, the current flowing across the FET 238 is ILAVE. For example, when the FET 238 is turned on (e.g., conducting between its drain and source terminals) and the FET 240 is turned off (e.g., not conducting between its drain and source terminals), the circuit 200 is in a sensing phase. While in the sensing phase, the FET 238 is controlled to be turned on, the replica FET 210 is controlled to be turned on, the switch 202 is controlled to be closed, and the switch 204 is controlled to be open. As shown in FIG. 2A, this configuration forms three signal paths in the circuit 200 during the sensing phase. A first path 242 is formed from the node 226 to the node 222, passing through the FET 238. A second path 244 is formed from the node 226 to the node 230 through the replica FET 210, continuing on through the voltage controlled current source 214. A third path 246 is formed from the node 226 to the node 222 through the capacitor 208, the resistor 206, and the switch 202.

In at least some examples, the node 222 is a switch node of the power converter 110 to which, in some examples, an inductor (not shown) couples. During the sensing phase, current flowing into the node 222 through the first path 242 and the second path 244 flows to a device coupled to the node 222 (e.g., such that an inductor coupled to the node 222 is charged during the first phase). Further during the sensing phase, the capacitor 208 is charged.

In another example of operation, the circuit 200 monitors a current across the FET 238 to output a signal at the node 236 having a current proportional to the current flowing through the node 222. In at least some examples, such as when the node 222 is coupled to a terminal of an inductor, the current flowing through the node 222 is IINAVE. When the FET 238 is turned off and the FET 240 is turned on, the circuit 200 is in an averaging phase. While in the averaging phase, the FET 238 is controlled to be turned off, the FET 240 is controlled to be turned on, the replica FET 210 is controlled to be turned on, the switch 202 is controlled to be open, and the switch 204 is controlled to be closed. As show in FIG. 2B, this configuration forms up to three signal paths in the circuit 200 during the averaging phase. A first path 244 is formed from the node 226 to the node 230 through the replica FET 210, continuing on through the voltage controlled current source 214. A second path 248 is formed from the node 226 back to the node 226 through the switch 204, the resistor 206, and the capacitor 208. A third path 250, in some examples, is formed between the node 222 and the source terminal of the FET 240, where the source terminal of the FET 240 may couple to various components or nodes according to a topology of the power converter 110. During the averaging phase, the capacitor 208 discharges to the node 226 and the resistor 206 and the capacitor 208 together form a low-pass filter having an output at the node 230. Accordingly, during the averaging phase, a signal present at the node 230 represents a low-pass filtering of a signal present at the node 226.

In each phase, both sensing and averaging, the amplifier 212 amplifies a difference between a value of a signal present at the node 230 and a value of a signal present at the node 228. This difference is amplified by the amplifier 212 according to a gain of the amplifier 212 and is output as a current signal. Accordingly, in at least some examples the amplifier 212 is a transconductance amplifier. The current signal output by the amplifier 212 charges the capacitor 213 to cause a voltage present at the node 232 to increase with time. The voltage present at the node 232, in at least some examples, controls the voltage controlled current source 214 and the voltage controlled current source 216. For example, as the voltage present at the node 232 increases, the current generated by the voltage controlled current source 214 and the voltage controlled current source 216 also increases. In at least some examples, the current of the voltage controlled current source 214, generated based on control of the voltage present at the node 232, is sunk from the node 226 through the replica FET 210. Because the voltage present at the node 232 also controls the voltage controlled current source 216, a current sunk by the voltage controlled current source 216 from the node 236 is approximately equal to a current flowing through the node 230.

Figure 5:
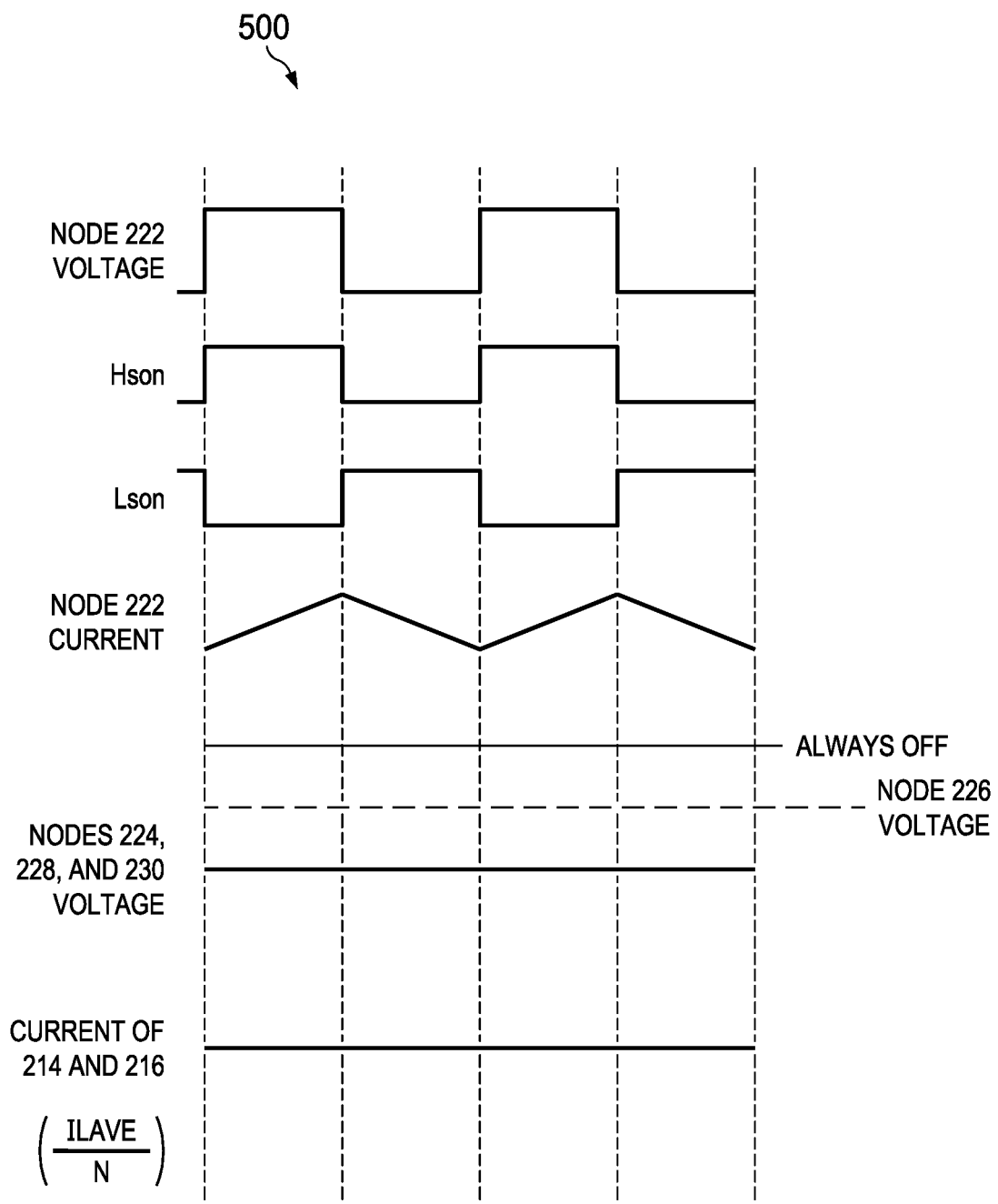
FIG. 5 shows a diagram of illustrative signal waveforms in a current sense circuit in accordance with various examples.

Based on the above actions of the sensing phase, the switch 202 samples a voltage across the FET 238, where the sampled voltage is present at the node 224. The resistor 206 and the capacitor 208 filter the sampled voltage to generate a filtered signal present at the node 228. The filtered signal present at the node 228, in at least some examples, is an average of the signal present at the node 224. The amplifier 212, the capacitor 213, and the voltage controlled current source 214 together form a negative feedback loop. The negative feedback loop controls an amount of current sunk from the node 230 by the voltage controlled current source 214 to force a potential present at the node 230 to approximately equal a potential of the filtered signal present at the node 228. An average voltage difference of node 226 minus node 224, which is approximately equal to the average voltage difference of node 226 minus node 228, is forced across the replica FET 210 by the negative feedback loop. Because there is no direct current (DC) flowing through the inputs of the amplifier 212 and no DC flowing through into capacitor 208, there is no DC flowing through the resistor 206. Because no DC flows through the resistor 206, there is no DC voltage drop across the resistor 206. Further, because the replica FET 210 is a scaled replica of the FET 238 (e.g., N times smaller than the FET 238), a current flowing through the replica FET 210 is approximately equal to a current conducted by the voltage controlled current source 214. The current conducted by the voltage controlled current source 214 is in turn approximately equal to a result of an average current flowing through the FET 238 divided by N. Thus, the current conducted by the voltage controlled current source 214 is approximately equal to ILAVE divided by N. Because the voltage controlled current source 214 and the voltage controlled current source are controlled according to the same voltage present at the node 232, a current sunk from the node 236 is also approximately equal to ILAVE divided by N. Additionally, at least some of the above signals present in the circuit 200 while operating in the sensing phase are illustrated in FIG. 5, which is a diagram of illustrative signal waveforms.

Figure 6:
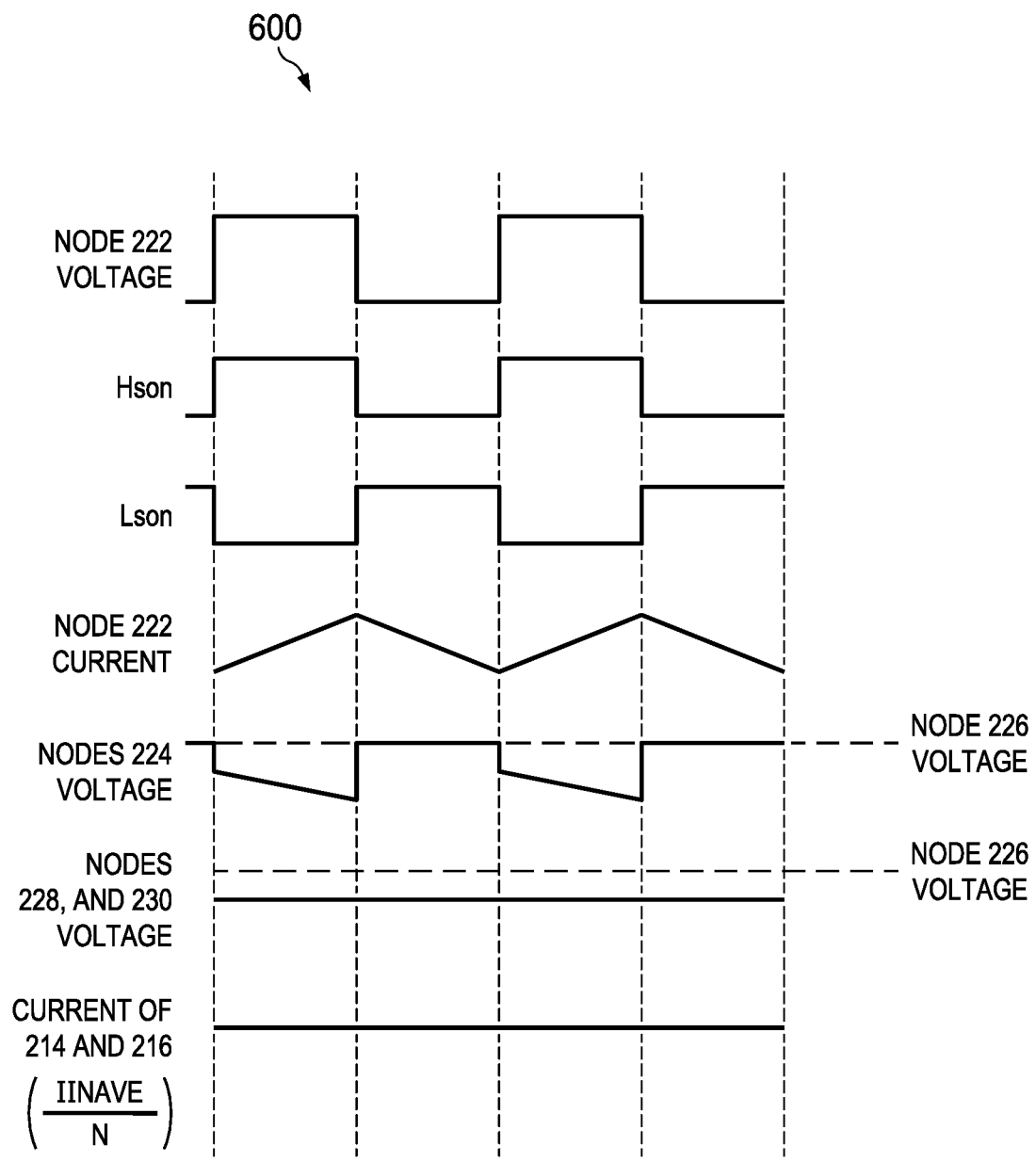
FIG. 6 shows a diagram of illustrative signal waveforms in a current sense circuit in accordance with various examples.

Further, based on the above actions of the averaging phase, the switch 204 samples a voltage present at the node 226. As in the sensing phase, the resistor 206 and the capacitor 208 filter the sampled voltage present at the node 224 to generate a filtered signal present at the node 228. Again, the filtered signal present at the node 228 is, in some examples, an average of the sampled voltage present at the node 224. The negative feedback loop controls the amount of current sunk from the node 230 by the voltage controlled current source 214 to force a potential present at the node 230 to approximately equal a potential of the filtered signal present at the node 228. Because a current flowing through the replica FET 210 is approximately the same as a current flowing through the node 224 (and therefore node 226), the current flowing through the node 226 is approximately equal to a current conducted by the voltage controlled current source 214. The current conducted by the voltage controlled current source 214 is in turn approximately equal to IINAVE. Because the voltage controlled current source 214 and the voltage controlled current source are controlled according to the same voltage present at the node 232, a current sunk from the node 236 is also approximately equal to IINAVE. Additionally, at least some of the above signals present in the circuit 200 while operating in the averaging phase are illustrated in FIG. 6, which is a diagram of illustrative signal waveforms.

In at least some examples, IINAVE, as sunk by the circuit 200 from the node 236, is approximately equal to D*ILAVE_TON, where D is a duty cycle of the FET 238 and ILAVE_TON is ILAVE during an on time of the FET 238. An average voltage across the capacitor 208 is approximately equal to a difference in voltage present at the node 226 and at the node 228, which approximately equals IINAVE multiplied by a drain to source resistance of the FET 238. When the circuit 200 is operating in a discontinuous conduction mode, ILAVE is approximately equal to ILAVE_TON*(TON+TOFF)/T, where ILAVE_TON and TON are as defined above, TOFF is the off time of the FET 238, and T is a switching period of the FET 238. When the circuit 200 is operating in a continuous conduction mode, ILAVE is approximately equal to ILAVE_TON, as defined above.

Figure 3A:
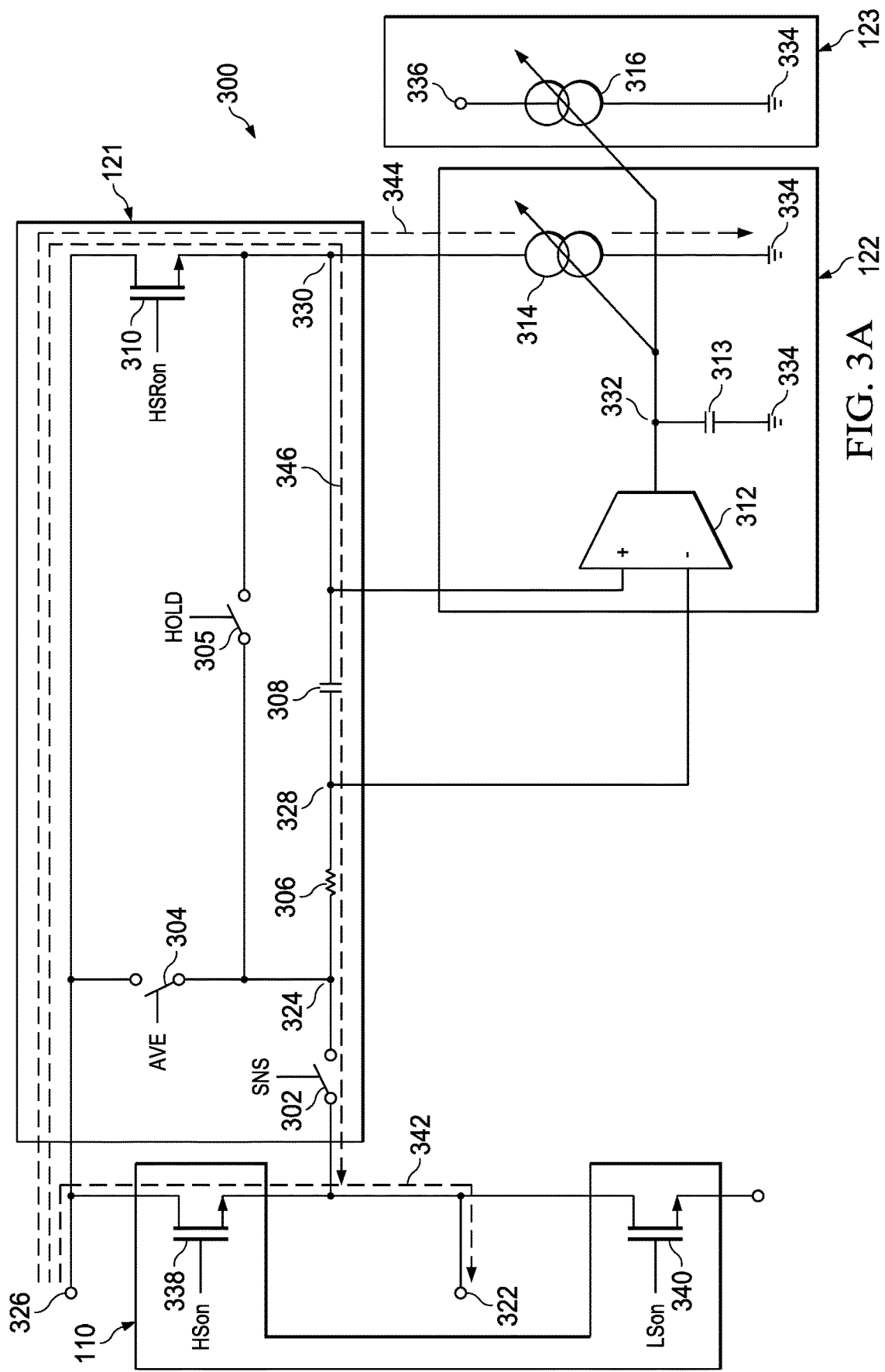
FIG. 3A shows a schematic diagram of an illustrative current sense circuit in accordance with various examples.
Figure 3B:
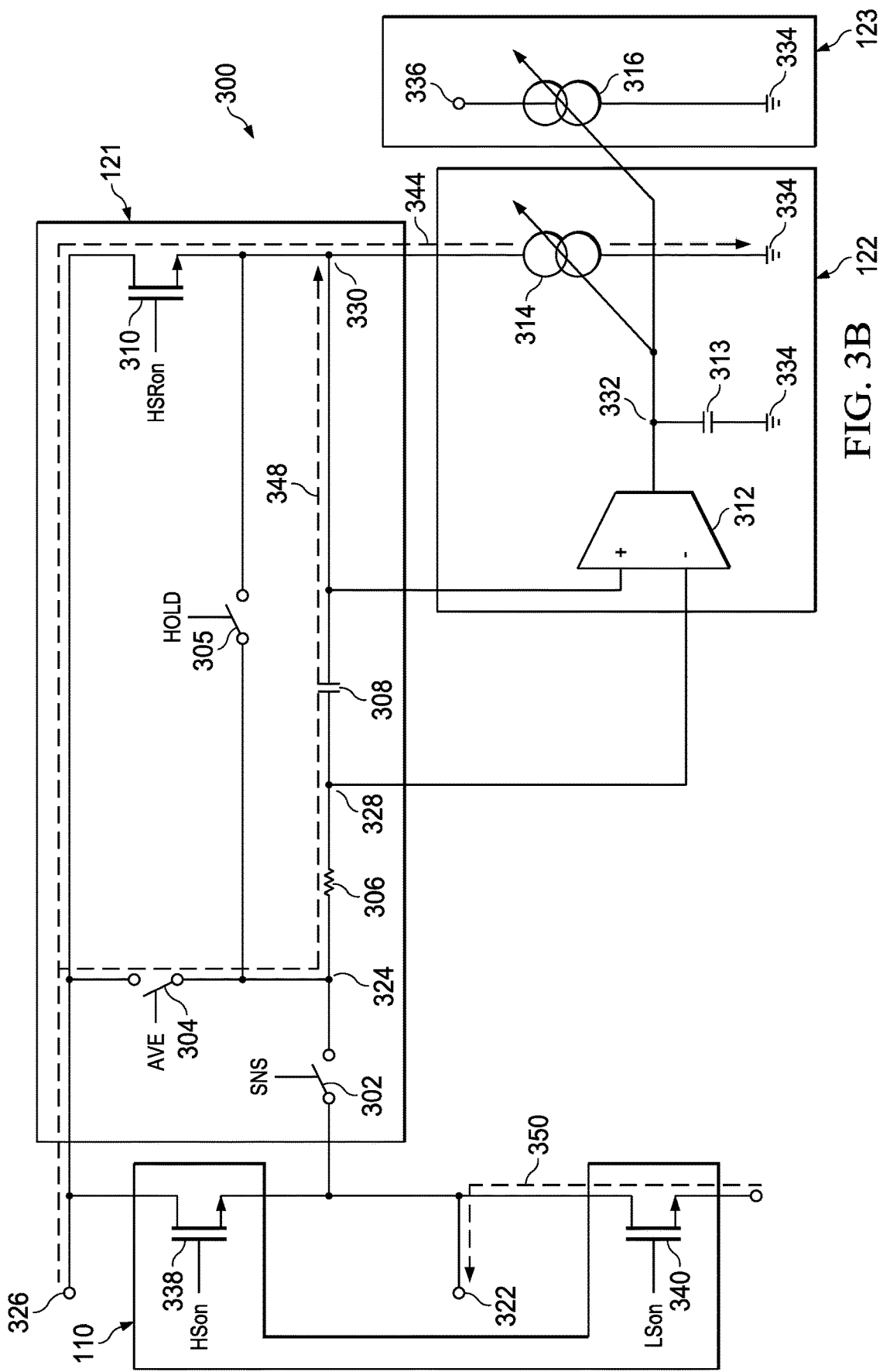
FIG. 3B shows a schematic diagram of an illustrative current sense circuit in accordance with various examples.
Figure 3C:
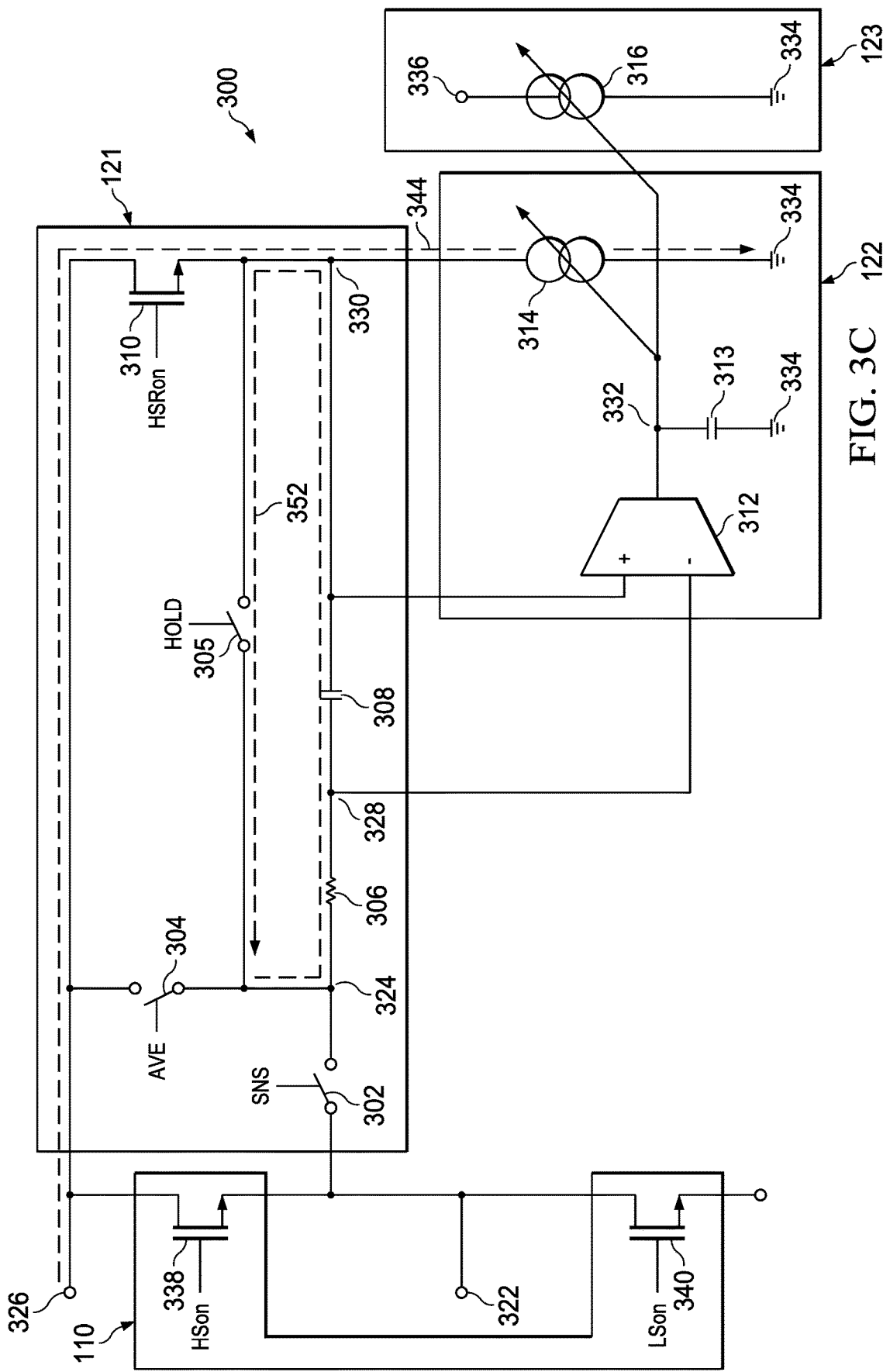
FIG. 3C shows a schematic diagram of an illustrative current sense circuit in accordance with various examples.

Turning now to FIGS. 3A, 3B, and 3C, schematic diagrams of an illustrative current sense circuit 300 are shown. In at least some examples, the circuit 300 is suitable for implementation as the current sense circuit 120 of the SMPS 100 of FIG. 1. Accordingly, reference is made to at least some components of FIG. 1 in describing FIG. 3. The circuit 300, in some examples, is suitable for monitoring IINAVE and ILAVE (non-simultaneously) in buck power converter topology, an inverting buck power converter topology, and/or a buck-boost power converter topology.

In an example architecture, the circuit 300 includes a switch 302, a switch 304, a switch 305, a resistor 306, a capacitor 308, a replica FET 310, an amplifier 312, a capacitor 313, voltage controlled current source 314, and a voltage controlled current source 316. The switch 302 is coupled between a node 322 and a node 324. The switch 304 is coupled between a node 326 and the node 324. The switch 305 is coupled between the node 324 and a node 330. The resistor 306 is coupled between the node 324 and a node 328. The capacitor 308 is coupled between the node 328 and the node 330. The replica FET 310 has a drain terminal coupled to the node 326, a source terminal coupled to the node 330, and a gate terminal. The amplifier 312 has a first input terminal (e.g., a non-inverting input terminal) coupled to the node 330, a second input terminal (e.g., an inverting input terminal) coupled to the node 328, and an output terminal coupled to a node 332. In at least some examples, the capacitor 313 is coupled between the node 332 and a ground node 334. The voltage controlled current source 314 has a first terminal coupled to the node 330, a second terminal coupled to the ground node 334, and a control terminal coupled to the node 332. The voltage controlled current source 316 has a first terminal coupled to a node 336, a second terminal coupled to the ground node 334, and a control terminal coupled to the node 332. In at least some examples, a current mirror (not shown) is coupled between the node 336 and a node at which the circuit 300 outputs a signal representative of the current flowing through the power converter 110. In some examples, the current mirror is coupled between the node 336 and the node 162 of FIG. 1 to provide the signal representative of the current flowing through the power converter 110 at the node 162. In other examples, the signal representative of the current flowing through the power converter 110 is provided directly at the node 336, for example, such that the node 336 and the node 162 may be regarded as being the same node.

In at least some examples, the circuit 300 is implemented on a same die as at least some transistors that will be monitored by the circuit 300. For example, the circuit 300 may be implemented on a same die as at least some components of the power converter 110. In such examples, the circuit 300 further includes, or is configured to couple to, a FET 338 and a FET 340. The FET 338 has a drain terminal coupled to the node 326, a source terminal coupled to the node 322, and a gate terminal. The FET 340 has a drain terminal coupled to the node 322, a source terminal, and a gate terminal. A point to which the source terminal of the FET 340 couples, or is configured to couple, may depend on a particular topology and/or desired operation of the power converter 110. Additionally, in at least some examples the switch 302 is configured to receive and be controlled by a sense phase control signal (SNS) and the switch 304 is configured to receive and be controlled by an average phase control signal (AVE). Further, the switch 305 is configured to receive and be controlled by a hold phase control signal (HOLD). The FET 338 is configured to receive, at its gate terminal, and be controlled by HSon. The FET 340 is configured to receive, at its gate terminal, and be controlled by LSon. The replica FET 310 is configured to receive, at its gate terminal, and be controlled by HSRon. When SNS is asserted, the switch 302 is closed. Otherwise, the switch 302 is open. When AVE is asserted, the switch 304 is closed. Otherwise, the switch 304 is open. When HOLD is asserted, the switch 305 is closed. Otherwise, the switch 305 is open. In at least some examples, only one of SNS, AVE, or HOLD is asserted at a given point in time.

In an example of operation, the circuit 300 monitors a current across the FET 338 to output a signal at the node 336 having a current proportional to the current across the FET 338 (e.g., a current flowing through the power converter 110). For example, when the FET 338 is turned on (e.g., conducting between its drain and source terminals) and the FET 340 is turned off (e.g., not conducting between its drain and source terminals), the circuit 300 is in a sensing phase. While in the sensing phase, the FET 338 is controlled to be turned on, the replica FET 310 is controlled to be turned on, the switch 302 is controlled to be closed, the switch 304 is controlled to be open, and the switch 305 is controlled to be open. As shown in FIG. 3A, this configuration forms three signal paths in the circuit 300 during the sensing phase. A first path 342 is formed from the node 326 to the node 322, passing through the FET 338. A second path 344 is formed from the node 326 to the ground node 334 through the replica FET 310, node 330 and voltage controlled current source 314. A third path 346 is formed from the node 326 to the node 322 through the replica FET 310, the capacitor 308, the resistor 306, and the switch 302.

In at least some examples, the node 322 is a switch node of the power converter 110 to which, in some examples, an inductor (not shown) couples. During the sensing phase, current flowing into the node 322 through the first path 342 and the second path 344 flows to a device coupled to the node 322 (e.g., such that an inductor coupled to the node 322 is charged during the first phase). Further during the sensing phase, the capacitor 308 is charged.

When the FET 338 is turned off and the FET 340 is turned on, the circuit 300 is in an averaging phase. While in the averaging phase, the FET 338 is controlled to be turned off, the FET 340 is controlled to be turned on, the replica FET 310 is controlled to be turned on, the switch 302 is controlled to be open, the switch 304 is controlled to be closed, and the switch 305 is controlled to be open. As shown in FIG. 3B, this configuration forms up to three signal paths in the circuit 300 during the averaging phase. A first path 344 is formed from the node 326 to the node 330 through the replica FET 310. A second path is formed from the node 326 back to the node 326 through the switch 304, the resistor 306, and the capacitor 308. A third path 350, in some examples, is formed between the node 322 and the source terminal of the FET 340, where the source terminal of the FET 340 may couple to various components or nodes according to a topology of the power converter 110. During the averaging phase, the capacitor 308 discharges to the node 326 and the resistor 306 and the capacitor 308 together form a filter having an output at the node 330. Accordingly, during the averaging phase, a signal present at the node 330 is a low-pass filtering of a signal present at the node 326.

When the FET 338 and the FET 340 are both turned off, the circuit 300 is a holding phase. While in the holding phase, the FET 338 is controlled to be turned off, the FET 340 is controlled to be turned off, the replica FET 310 is controlled to be turned on, the switch 302 is controlled to be open, the switch 304 is controlled to be open, and the switch 305 is controlled to be closed. As shown in FIG. 3C, this configuration forms two signal paths in the circuit 300 during the holding phase. A first path 344 is formed from the node 326 to the node 330 through the replica FET 310 and the voltage controlled current source 314. A second path 352 is formed in a loop from the node 330 through the switch 305, the resistor 306, and the capacitor 308 back to the node 330.

In each phase, sensing, averaging, and holding, the amplifier 312 amplifies a difference between a value of a signal present at the node 330 and a value of a signal present at the node 328. The capacitor 308, in at least some examples, is a coupling capacitor between the node 328 and the node 330 that improves common-mode response in the circuit 300. The capacitor 308 improves the common mode response of the circuit 300 by making noise present at the node 328 and the node 330 appear as a common-mode signal from a perspective of the amplifier 312. Making noise present at the node 328 and the node 330 appear as a common-mode signal to the amplifier 312, in at least some examples, mitigates an effect of the noise on an output signal of the amplifier 312. This difference between the value of the signal present at the node 330 and the value of a signal present at the node 328 is amplified by the amplifier 312 according to a gain of the amplifier 312 and is output as a current signal. Accordingly, in at least some examples the amplifier 312 is a transconductance amplifier. The current signal output by the amplifier 312 charges the capacitor 313 to cause a voltage present at the node 332 to increase with time. The voltage present at the node 332, in at least some examples, controls the voltage controlled current source 314 and the voltage controlled current source 316. For example, as the voltage present at the node 332 increases, the current generated by the voltage controlled current source 314 and the voltage controlled current source 316 also increases. In at least some examples, the current of the voltage controlled current source 314, generated based on control of the voltage present at the node 332, is sunk from the node 326 through the replica FET 310. Because the voltage present at the node 332 also controls the voltage controlled current source 316, a current sunk by the voltage controlled current source 316 from the node 336 is approximately equal to a current flowing through the node 330.

Figure 7:
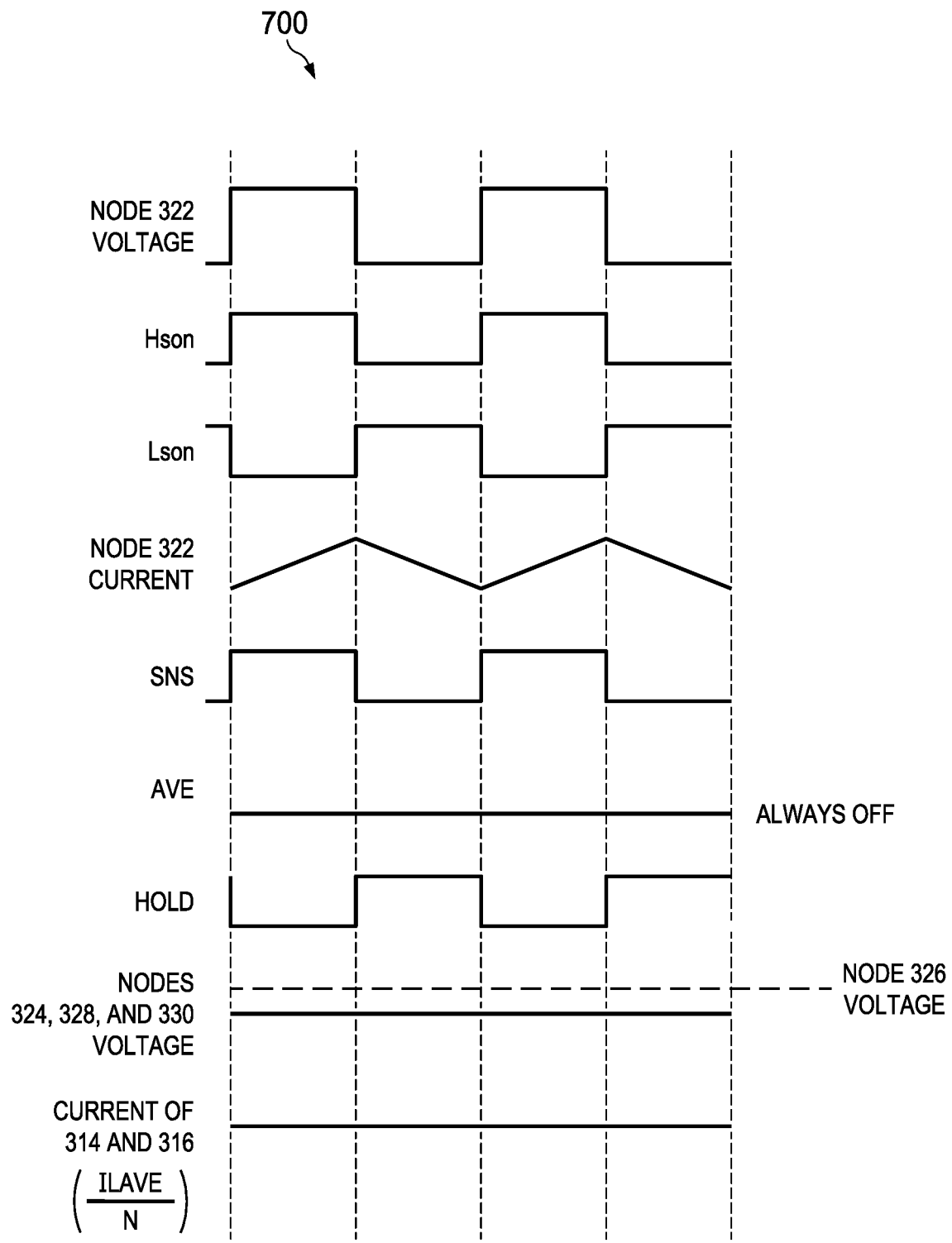
FIG. 7 shows a diagram of illustrative signal waveforms in a current sense circuit in accordance with various examples.
Figure 8:
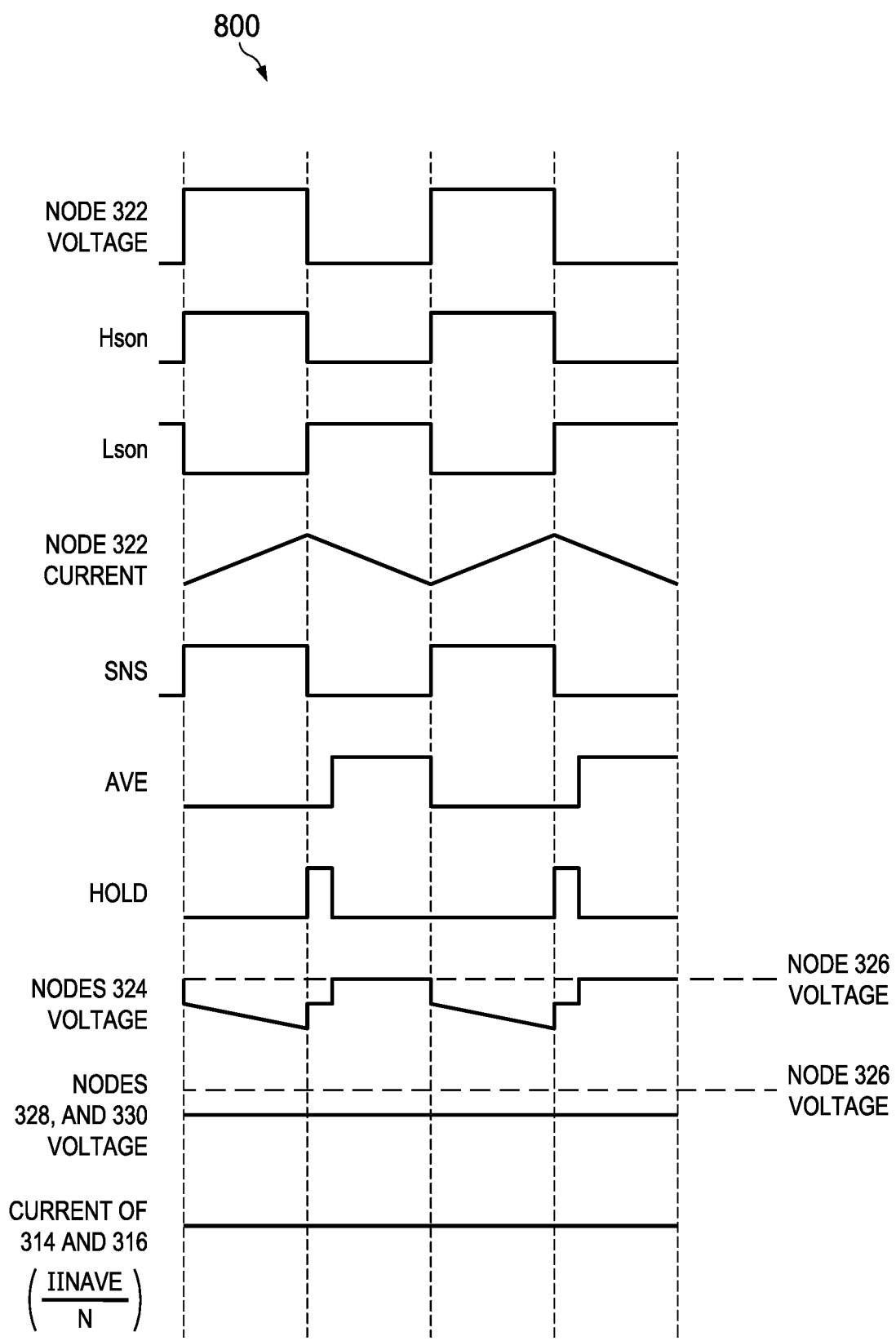
FIG. 8 shows a diagram of illustrative signal waveforms in a current sense circuit in accordance with various examples.

Operation of the circuit 300 in the averaging phase and the sensing phase, in at least some examples, follows a same general principle of operation of the circuit 200 in the averaging and sensing phases, respectively, with some exceptions. For example, as discussed above, in the circuit 300 the capacitor 308 is coupled between the first input terminal and the second input terminal of the amplifier 312. By coupling the capacitor 308 between the input terminals of the amplifier 312, noise rejection at the input terminals of the amplifier 312 is improved. For example, alternating current disturbance or noise present at the node 328 and/or the node 330 is made common for both inputs of the amplifier 312, thus negating an impact of that alternating current disturbance or noise in an output of the amplifier 312 at the node 332. Additionally, a direct current operating voltage of the capacitor 308 is approximately zero, which increases a speed of the circuit 300 settling to an operation point when compared to other circuits that lack the capacitor 308 coupled as in the circuit 300. Furthermore, some circumstances may exist in the circuit 300 in which neither AVE nor SNS is asserted. Under such circumstances, the node 324 may be floating or otherwise have an unknown potential, which may result in undesirable operation of the circuit 300. To maintain a defined potential at the node 324, the switch 305, when neither AVE nor SNS is asserted HOLD is asserted. When HOLD is asserted, the switch 305 couples the node 324 to the node 330, providing a known potential at the node 324. Additionally, at least some of the above signals present in the circuit 300 while operating in the sensing phase are illustrated in FIG. 7, which is a diagram of illustrative signal waveforms. Furthermore, at least some of the above signals present in the circuit 300 while operating in the averaging phase are illustrated in FIG. 8, which is a diagram of illustrative signal waveforms.

In at least some examples, IINAVE, as sunk by the circuit 300 from the node 336, is approximately equal to D*ILAVE_TON, where D and ILAVE_TON are each as described above with respect to the circuit 200 of FIG. 2. An average voltage across the capacitor 308 is approximately equal to zero. This results from a comparatively high gain of the amplifier 312, which forces a differential input of the amplifier 312, across which the capacitor 308 is coupled, to approximately equal zero. When the circuit 300 is operating in a discontinuous conduction mode, ILAVE is approximately equal to ILAVE_TON*(TON+TOFF)/T, where ILAVE_TON, TOFF, and T are as described above with respect to the circuit 200. When the circuit 300 is operating in a continuous conduction mode, ILAVE is approximately equal to ILAVE_TON, as defined above with respect to the circuit 200.

Figure 4A:
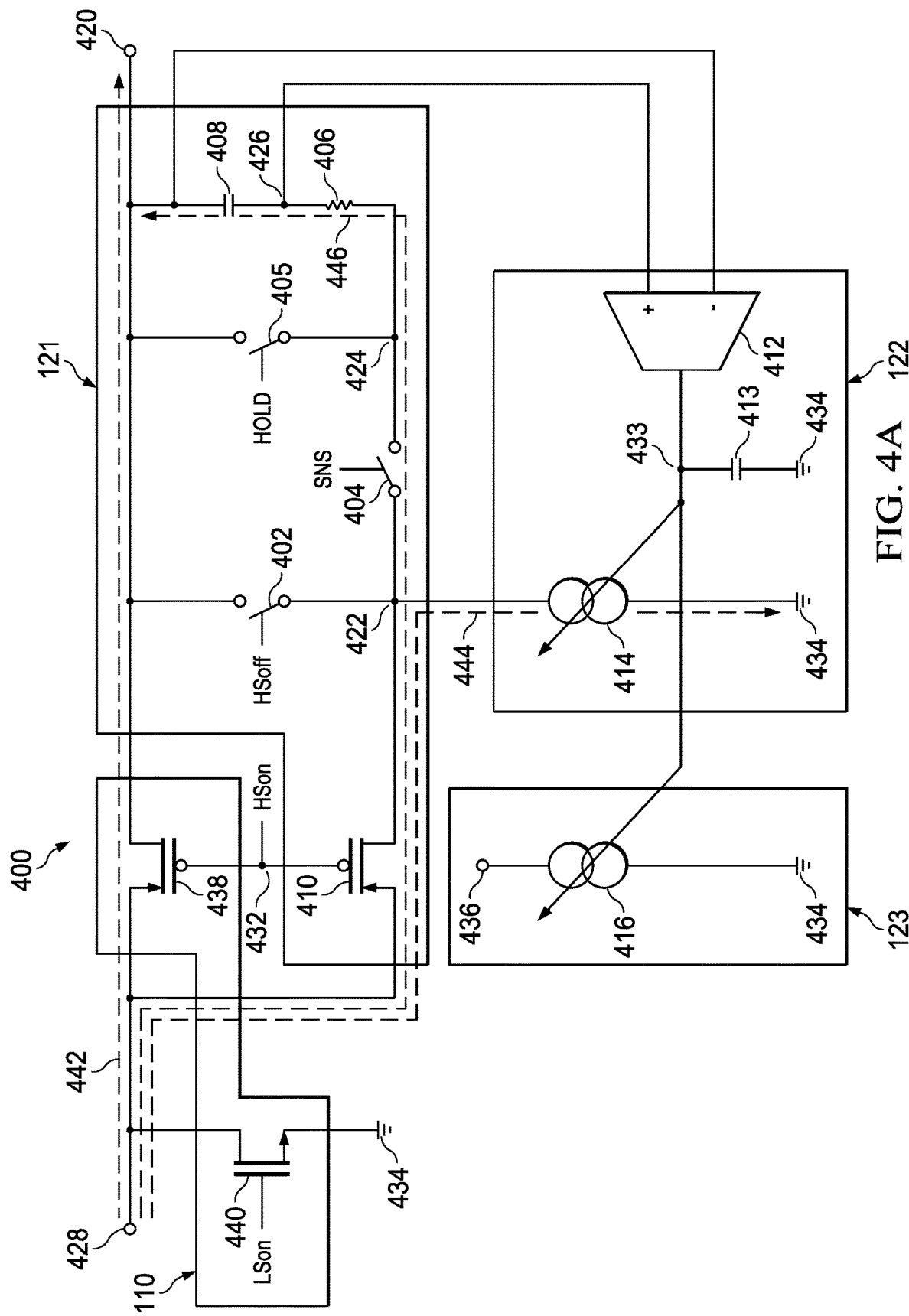
FIG. 4A shows a schematic diagram of an illustrative current sense circuit in accordance with various examples.
Figure 4B:
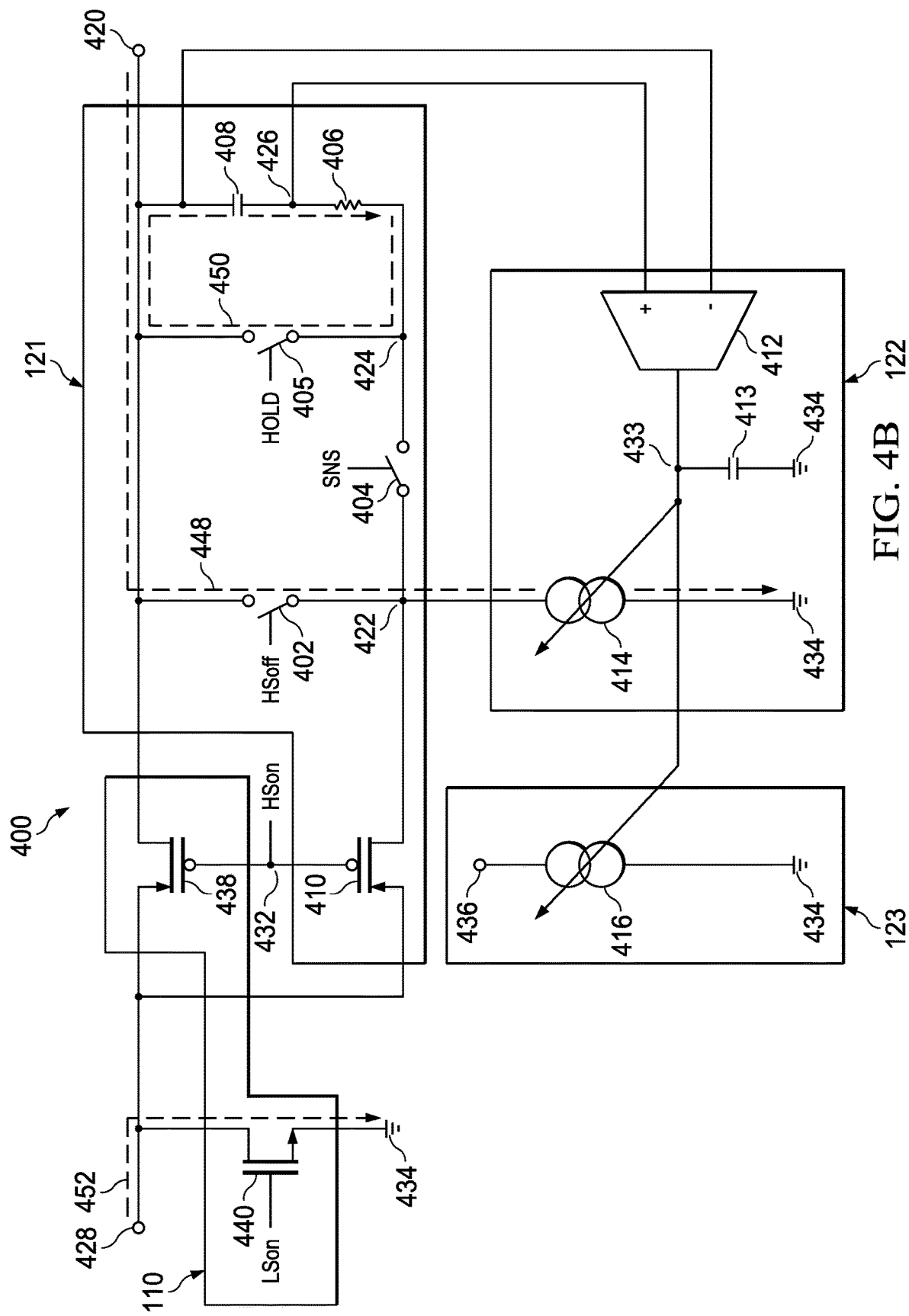
FIG. 4B shows a schematic diagram of an illustrative current sense circuit in accordance with various examples.

Turning now to FIGS. 4A and 4B, schematic diagrams of an illustrative current sense circuit 400 are shown. In at least some examples, the circuit 400 is suitable for implementation as the current sense circuit 120 of the SMPS 100 of FIG. 1. Accordingly, reference is made to at least some components of FIG. 1 in describing FIG. 4. The circuit 400, in some examples, is suitable for monitoring IINAVE and ILAVE (non-simultaneously) in boost power converter topology.

In an example architecture, the circuit 400 includes a switch 402, a switch 404, a switch 405, a resistor 406, a capacitor 408, a replica FET 410, an amplifier 412, a capacitor 413, voltage controlled current source 414, and a voltage controlled current source 416. The switch 402 is coupled between a node 420 and a node 422. The switch 404 is coupled between the node 422 and the node 424. The switch 405 is coupled between the node 420 and the node 424. The resistor 406 is coupled between the node 424 and a node 426. The capacitor 408 is coupled between the node 426 and the node 420. The replica FET 410 has a drain terminal coupled to the node 422, a source terminal coupled to the node 428, and a gate terminal coupled to a node 432. The amplifier 412 has a first input terminal (e.g., a non-inverting input terminal) coupled to the node 426, a second input terminal (e.g., an inverting input terminal) coupled to the node 420, and an output terminal coupled to a node 433. In at least some examples, the capacitor 413 is coupled between the node 433 and a ground node 434. The voltage controlled current source 414 has a first terminal coupled to the node 422, a second terminal coupled to the ground node 434, and a control terminal coupled to the node 433. The voltage controlled current source 416 has a first terminal coupled to a node 436, a second terminal coupled to the ground node 434, and a control terminal coupled to the node 433. In at least some examples, a current mirror (not shown) is coupled between the node 436 and a node at which the circuit 400 outputs a signal representative of the current flowing through the power converter 110. In some examples, the current mirror is coupled between the node 436 and the node 162 of FIG. 1 to provide the signal representative of the current flowing through the power converter 110 at the node 162. In other examples, the signal representative of the current flowing through the power converter 110 is provided directly at the node 436, for example, such that the node 436 and the node 162 may be regarded as being the same node.

In at least some examples, the circuit 400 is implemented on a same die as at least some transistors that will be monitored by the circuit 400. For example, the circuit 400 may be implemented on a same die as at least some components of the power converter 110. In such examples, the circuit 400 further includes, or is configured to couple to, a FET 438 and a FET 440. The FET 438 has a drain terminal coupled to the node 420, a source terminal coupled to the node 428, and a gate terminal coupled to the node 432. The FET 440 has a drain terminal coupled to the node 428, a source terminal coupled to the ground node 434, and a gate terminal. In at least some examples, the switch 402 is replaced by, or implemented as, a second replica FET (not shown). In such examples, the circuit 400 may have added functionality of outputting a signal at the node 436 that is representative of an output current (e.g., current at the node 420) of the circuit 400. Additionally, in at least some examples the switch 402 is configured to receive and be controlled by an inversion of a high-side control signal (HSoff). The switch 404 is configured to receive and be controlled by SNS. Further, the switch 405 is configured to receive and be controlled by HOLD. The replica FET 410 and the FET 438 are configured to receive, at their gate terminals, and be controlled by HSon. The FET 440 is configured to receive, at its gate terminal, and be controlled by LSon. When HSoff is asserted, the switch 402 is closed. Otherwise, the switch 402 is open. When SNS is asserted, the switch 404 is closed. Otherwise, the switch 404 is open. When HOLD is asserted, the switch 405 is closed. Otherwise, the switch 405 is open.

In an example of operation, the circuit 400 monitors a current across the FET 438 to output a signal at the node 436 having a current proportional to the current across the FET 438 (e.g., a current flowing through the power converter 110). For example, when the FET 438 is turned on (e.g., conducting between its drain and source terminals) and the FET 440 is turned off (e.g., not conducting between its drain and source terminals), the circuit 400 is in a sensing phase. While in the sensing phase, the FET 438 is controlled to be turned on, the replica FET 410 is controlled to be turned on, the switch 402 is controlled to be closed, the switch 404 is controlled to be open, and the switch 405 is controlled to be open. As shown in FIG. 4A, this configuration forms three signal paths in the circuit 400 during the sensing phase. A first path 442 is formed from the node 428 to the node 420, passing through the FET 438. A second path 444 is formed from the node 428 to the ground node 434 through the replica FET 410 and the voltage controlled current source 414. A third path 446 is formed from the node 428 to the node 420 through the replica FET 410, the switch 404, the resistor 406, and the capacitor 408. During the sensing phase, the resistor 406 and the capacitor 408 together form a filter having an output at the node 426. Accordingly, during the sensing phase, a signal present at the node 426 is a low-pass filtering of a signal present at the node 424. In at least some examples, the node 428 is a switch node of the power converter 110 to which, in some examples, an inductor (not shown) couples.

When the FET 438 is turned off and the FET 440 is turned on, the circuit 400 is in a holding phase. While in the holding phase, the FET 438 is controlled to be turned off, the FET 440 is controlled to be turned on, the replica FET 410 is controlled to be turned off, the switch 402 is controlled to be open, the switch 404 is controlled to be closed, and the switch 405 is controlled to be closed. As shown in FIG. 4B, this configuration forms up to three signal paths in the circuit 400 during the holding phase. A first path 448 is formed from the node 420 to the ground node 434 through the switch 402 and the voltage controlled current source 414. A second path 450 is formed from the node 424 back to the node 424 through the switch 405, the resistor 406, and the capacitor 408. A third path 452, in some examples, is formed between the node 428 and the ground node 434 through the FET 440.

In each phase, both sensing and holding, the amplifier 412 amplifies a difference between a value of a signal present at the node 426 and a value of a signal present at the node 420. This difference is amplified by the amplifier 412 according to a gain of the amplifier 412 and is output as a current signal. Accordingly, in at least some examples the amplifier 412 is a transconductance amplifier. The current signal output by the amplifier 412 charges the capacitor 413 to cause a voltage present at the node 433 to increase with time. The voltage present at the node 433, in at least some examples, controls the voltage controlled current source 414 and the voltage controlled current source 416. For example, as the voltage present at the node 433 increases, the current generated by the voltage controlled current source 414 and the voltage controlled current source 416 also increases. In at least some examples, the current of the voltage controlled current source 414, generated based on control of the voltage present at the node 433, is sunk from the node 428 through the replica FET 410. Because the voltage present at the node 433 also controls the voltage controlled current source 416, a current sunk by the voltage controlled current source 416 from the node 436 is approximately equal to a current flowing through the node 422.

Figure 9:
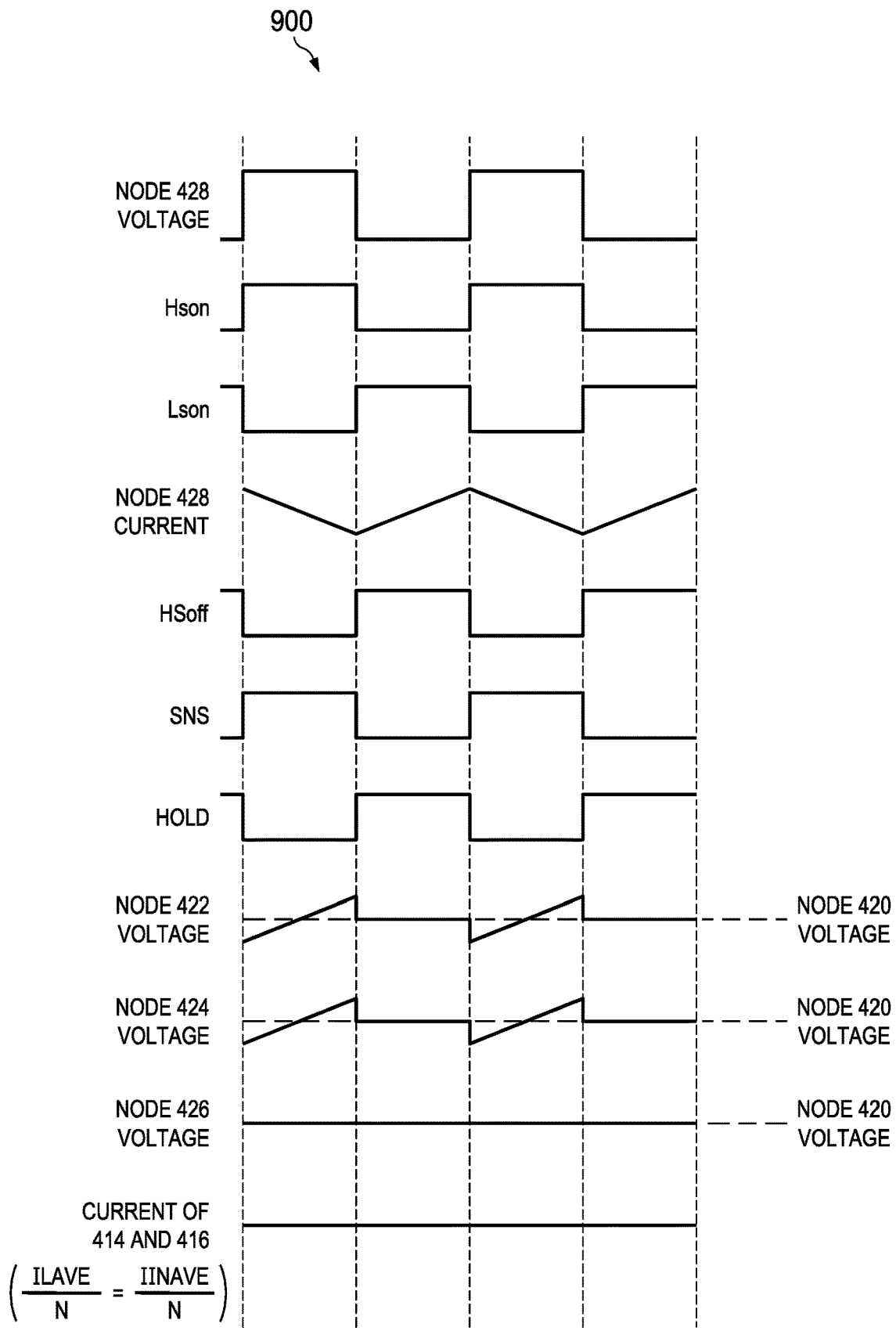
FIG. 9 shows a diagram of illustrative signal waveforms in a current sense circuit in accordance with various examples.

Based on the above actions of the sensing phase, the switch 404 samples a voltage across the replica FET 410, where the sampled voltage is present at the node 424. The resistor 406 and the capacitor 408 filter the sampled voltage to generate a filtered signal present at the node 426. The filtered signal present at the node 426, in at least some examples, is an average of the sampled voltage present at the node 424. The amplifier 412, the capacitor 413, and the voltage controlled current source 414 together form a negative feedback loop. The negative feedback loop controls an amount of current sunk from the node 422 by the voltage controlled current source 414 to force a potential present at the node 422 to approximately equal a potential of the filtered signal present at the node 426. This causes an average voltage drop across each of the FET 438 and the replica FET 410 to be approximately equal to ILAVE multiplied by a drain-to-source resistance of the FET 438 when the FET 438 is conductive. Because the replica FET 410 is a scaled replica of the FET 438 (e.g., N times smaller than the FET 438), a current flowing through the replica FET 410 is approximately equal to a current conducted by the voltage controlled current source 414. The current conducted by the voltage controlled current source 414 is in turn approximately equal to a result of an average current flowing through the FET 438 divided by N. Thus, the current conducted by the voltage controlled current source 414 is approximately equal to ILAVE divided by N. Because the voltage controlled current source 414 and the voltage controlled current source are controlled according to the same voltage present at the node 433, a current sunk from the node 436 is also approximately equal to ILAVE divided by N. Additionally, in at least some examples of the circuit 400 ILAVE is approximately equal to IINAVE. Accordingly, in at least some examples the current sunk from the node 436 is approximately equal to ILAVE divided by N. Additionally, in at least some examples the node 424 may be floating or otherwise have an unknown potential when SNS is de-asserted, which may result in undesirable operation of the circuit 400. To maintain a defined potential at the node 424, HOLD is asserted when SNS is de-asserted. When HOLD is asserted, the switch 405 couples the node 424 to the node 420, providing a known potential at the node 424. Additionally, at least some of the above signals present in the circuit 400 while operating in the sensing phase are illustrated in FIG. 9, which is a diagram of illustrative signal waveforms.

In at least some examples, IINAVE, as sunk by the circuit 400 from the node 336, is approximately equal to ILAVE which is approximately equal to ILAVE_TON, where ILAVE and ILAVE TON are each as described above with respect to the circuit 200 of FIG. 2. An average voltage across the capacitor 408 is approximately equal to zero. This results from a comparatively high gain of the amplifier 412, which forces a differential input of the amplifier 412, across which the capacitor 408 is coupled, to approximately equal zero. An average voltage between the node 428 and the node 424 is approximately equal IINAVE multiplied by a drain to source resistance of the FET 438, which approximately equals ILAVE multiplied by the drain to source resistance of the FET 438.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit adapted to be coupled between a first current terminal of a high-side transistor of a converter and a second current terminal of the high-side transistor, the circuit comprising:
    a first switch coupled between a first node and a second node, the first node adapted to be coupled to the second current terminal of the high-side transistor;
    a second switch connected between a third node and the second node, the third node adapted to be coupled to the first current terminal of the high-side transistor;
    a resistor connected between the second node and a fourth node;
    a capacitor comprising a first terminal coupled to the fourth node and a second terminal;
    a transistor comprising a drain terminal coupled to the third node, a source terminal coupled to a fifth node, and a gate terminal;
    an amplifier comprising a first input terminal coupled to the fifth node, a second input terminal coupled to the fourth node, and an output terminal coupled to a sixth node;
    a second capacitor coupled between the sixth node and a ground node;
    a first voltage controlled current source coupled between the fifth node and the ground node and controlled by a signal present at the sixth node; and
    a second voltage controlled current source coupled between a seventh node and the ground node and controlled by the signal present at the sixth node.

2. The circuit of claim 1, further comprising:
a third transistor comprising a drain terminal coupled to the first node.

3. The circuit of claim 2, wherein the third transistor is a low-side transistor of the power converter, and an inductor is configured to couple to the first node.

4. The circuit of claim 1, wherein the second terminal of the capacitor is coupled to the third node.

5. The circuit of claim 1, wherein the second terminal of the capacitor is coupled to the fifth node.

6. The circuit of claim 1, further comprising a third switch coupled between the third node and the fifth node.

7. A circuit adapted to be coupled between a first current terminal of a high-side transistor of a converter and a second current terminal of the high-side transistor, the circuit comprising:
    a first switch coupled between a first node and a second node;
    a second switch connected between the first node and a third node, the third node adapted to be coupled to the first current terminal of the high-side transistor;
    a third switch coupled between the second node and the third node;
    a resistor connected between the second nodes and a fourth node;
    a capacitor coupled between the fourth node and the third node;
    a first transistor comprising a drain terminal coupled to the first node, a source terminal coupled to a fifth node and adapted to be coupled to the second current terminal of the high-side transistor, and a gate terminal coupled to a control terminal of the high-side transistor; and
    an amplifier comprising a first input terminal coupled to the fourth node, a second input terminal coupled to the third node, and an output terminal coupled to a sixth node.

8. The circuit of claim 7, further comprising:
    a second capacitor coupled between the sixth node and a ground node;
    a first voltage controlled current source coupled between the first node and the ground node and controlled by a signal present at the sixth node; and
    a second voltage controlled current source coupled between a seventh node and the ground node and controlled by the signal present at the sixth node.

9. The circuit of claim 7, further comprising:
a third transistor comprising a drain terminal coupled to the fifth node and a source terminal coupled to a ground node.

10. The circuit of claim 9, wherein the first transistor is a replica transistor that is a scale-reduced replica of the high-side transistor.

11. The circuit of claim 9, wherein the third transistor is a low-side transistor of the power converter, and an inductor is configured to couple to the fifth node.

12. The circuit of claim 7, wherein the second switch is implemented as a transistor that is a replica transistor that is a scale-reduced replica of the first transistor.

13. A circuit, comprising:
    a high-side transistor comprising a drain terminal coupled to a first node, a source terminal coupled to a second node, and a gate terminal;
    a low-side transistor comprising a drain terminal coupled to the second node; and
    a current sense circuit coupled to the first node and the second node and including:
        a high-side replica transistor coupled to the high-side transistor; and
        an amplifier having an input connected to the first node through a capacitor;

wherein the current sense circuit is configured to:
operate in a first configuration to determine a current flowing through the high-side transistor based on the replica transistor and generate a signal with a value that is a scaled representation of the current flowing through the high-side transistor; and
operate in a second configuration to determine an average current flowing through the second node and generate a signal with a value that is a scaled representation of the average current flowing through the second node;
and wherein the current sense circuit comprises:
a first switch coupled between the second node and a third node;
a second switch coupled between the first node and the third node;
a resistor coupled between the third node and a fourth node;
a capacitor coupled between the fourth node and the first node;
a transistor comprising a drain terminal coupled to the first node, a source terminal coupled to a fifth node, and a gate terminal;
the amplifier has an output terminal coupled to a sixth node;
a second capacitor coupled between the sixth node and a ground node;
a first voltage controlled current source coupled between the fifth node and the ground node and controlled by a signal present at the sixth node; and
a second voltage controlled current source coupled between a seventh node and the ground node and controlled by the signal present at the sixth node.

14. The circuit of claim 13, wherein the current sense circuit is configured to operate according to the first configuration to:
sense a current at the first node via the replica transistor that is a scale-reduced replica of the high-side transistor;
average a current present at the second node to generate an averaged signal;
amplify a difference between the sensed current and the averaged signal to generate an amplification result; and
control a voltage controlled current source according to the amplification result to conduct a current having a value proportional to the current flowing through the high-side transistor.

15. The circuit of claim 13, wherein the current sense circuit is configured to operate according to the second configuration to:
sense a current at the first node via the replica transistor that is a scale-reduced replica of the high-side transistor;
average a current present at the first node to generate an averaged signal;
amplify a difference between the sensed current and the averaged signal to generate an amplification result; and
control a voltage controlled current source according to the amplification result to conduct a current having a value proportional to the current flowing through the second node.

16. A system, comprising:
a power converter, comprising:
a first transistor comprising a drain terminal coupled to a first node, a source terminal coupled to a second node, and a gate terminal; and
a second transistor comprising a drain terminal coupled to the second node; and
a current sense circuit coupled to the first node and the second node, and including:
a replica transistor coupled to the first transistor; and
an amplifier having an input connected to the first node through a capacitor;
wherein the current sense circuit is configured to:
operate in a first configuration to determine an input current of the power converter based on the replica transistor and generate a signal with a value that is a scaled representation of the input current of the power converter; and
operate in a second configuration to determine an average current flowing through the second node and generate a signal with a value that is a scaled representation of the average current flowing through the second node;
and wherein the current sense circuit comprises:
a first switch coupled between the second node and a third node;
a second switch coupled between the first node and the third node;
a resistor coupled between the third node and a fourth node;
a capacitor coupled between the fourth node and the first node;
a transistor comprising a drain terminal coupled to the first node, a source terminal coupled to a fifth node, and a gate terminal;
the amplifier has an output terminal coupled to a sixth node;
a second capacitor coupled between the sixth node and a ground node;
a first voltage controlled current source coupled between the fifth node and the ground node and controlled by a signal present at the sixth node; and
a second voltage controlled current source coupled between a seventh node and the ground node and controlled by the signal present at the sixth node.

17. The system of claim 16, wherein the current sense circuit is further configured to determine an output current of the power converter and generate a signal with a value that is a scaled representation of the output current of the power converter.

18. The system of claim 16, wherein the current sense circuit is configured to operate according to the first configuration to:
sense a current at the first node via a replica transistor that is a scale-reduced replica of the first transistor;
average a current present at the second node to generate an averaged signal;
amplify a difference between the sensed current and the averaged signal to generate an amplification result; and
control a voltage controlled current source according to the amplification result to conduct a current having a value proportional to the current flowing through the first transistor.

19. The system of claim 16, wherein the current sense circuit is configured to operate according to the second configuration to:
sense a current at the first node via a replica transistor that is a scale-reduced replica of the first transistor;
average a current present at the first node to generate an averaged signal;
amplify a difference between the sensed current and the averaged signal to generate an amplification result; and control a voltage controlled current source according to the amplification result to conduct a current having a value proportional to the current flowing through the second node.

* * * * *